US012698852B2

(12) United States Patent
Lee et al.

(10) Patent No.: US 12,698,852 B2
(45) Date of Patent: Aug. 4, 2026

(54) SEALING MEMBER, FLUID SUPPLYING DEVICE INCLUDING SEALING MEMBER, AND SUBSTRATE PROCESSING APPARATUS INCLUDING FLUID SUPPLYING DEVICE

(71) Applicant: SEMES CO., LTD., Cheonan-si (KR)

(72) Inventors: Joon Hee Lee, Cheonan-si (KR); Wook Sang Jang, Cheonan-si (KR); Dong Uk Kim, Cheonan-si (KR)

(73) Assignee: SEMES CO., LTD., Cheonan-si (KR)

( * ) Notice: Subject to any disclaimer, the term of this patent is extended or adjusted under 35 U.S.C. 154(b) by 234 days.

(21) Appl. No.: 18/607,484

(22) Filed: Mar. 17, 2024

(65) Prior Publication Data

US 2025/0003536 A1     Jan. 2, 2025

(30) Foreign Application Priority Data

Jun. 30, 2023     (KR) ........................ 10-2023-0085086

(51) Int. Cl.
| | |
|---|---|
| *F16L 23/22* | (2006.01) |
| *F16J 15/10* | (2006.01) |
| *H01J 37/32* | (2006.01) |
| *H10P 72/72* | (2026.01) |

(52) U.S. Cl.
CPC ............. *F16L 23/22* (2013.01); *F16J 15/104* (2013.01); *H01J 37/32513* (2013.01); *H01J 37/32724* (2013.01); *H10P 72/722* (2026.01); *H01J 2237/002* (2013.01); *H01J 2237/2007* (2013.01)

(58) Field of Classification Search
CPC .......... F16L 23/22; F16L 39/00; F16J 15/104; H01J 37/32513; H01J 37/32724; H01J 2237/002; H01J 2237/2007; H01L 21/6833; H01L 21/67126; H01L 21/6831; H01L 21/67109; H01L 21/67017; H01L 21/67276
USPC ......................................................... 361/234
See application file for complete search history.

(56) References Cited

U.S. PATENT DOCUMENTS

| | | | | |
|---|---|---|---|---|
| 2020/0411354 A1* | 12/2020 | Rao | ................... | H01J 37/32724 |
| 2021/0358726 A1* | 11/2021 | Ko | .................... | H01J 37/32724 |
| 2021/0398844 A1* | 12/2021 | Rhee | .................. | H10P 72/7626 |
| 2023/0356342 A1* | 11/2023 | Cho | ................... | H10P 72/0434 |

FOREIGN PATENT DOCUMENTS

| | | | |
|---|---|---|---|
| JP | H06232082 A | * | 8/1994 |
| JP | 2019-176018 | | 10/2019 |
| KR | 2021-0141104 | | 11/2021 |
| KR | 10-2023-0013937 | | 1/2023 |

* cited by examiner

*Primary Examiner* — Sreeya Sreevatsa

(57) ABSTRACT

Proposed are a sealing member that prevents fluid leakage even in a cryogenic environment, a fluid supplying device including the sealing member, and a substrate processing apparatus including the fluid supplying device. A sealing member according to an embodiment includes a sealing jacket having a ring shape, an upper O-ring mounted on an upper surface of the sealing jacket, a lower O-ring mounted on a lower surface of the sealing jacket, and a pressure ring inserted into a receiving portion of the sealing jacket and pressing the upper surface and the lower surface.

20 Claims, 13 Drawing Sheets

320A (320)

320A (320)

320A (320)

320B (320)

320B (320)

SEALING MEMBER, FLUID SUPPLYING DEVICE INCLUDING SEALING MEMBER, AND SUBSTRATE PROCESSING APPARATUS INCLUDING FLUID SUPPLYING DEVICE

CROSS REFERENCE TO RELATED APPLICATION

The present application claims priority to Korean Patent Application No. 10-2023-0085086, filed Jun. 30, 2023, the entire contents of which is incorporated herein for all purposes by this reference.

BACKGROUND

Field of the Invention

The present disclosure relates to a sealing member that seals a connection portion of a fluid supplying pipe, a fluid supplying device including the sealing member, and a substrate processing apparatus including the fluid supplying device.

Description of the Related Art

A semiconductor manufacturing process is a process for the manufacture of a semiconductor device on a substrate (e.g., a wafer). The process includes, for example, exposure, deposition, etching, ion implantation, cleaning, and the like. In order to perform each manufacturing process, various semiconductor manufacturing equipment is provided in a clean room of a semiconductor manufacturing plant. A substrate fed into each semiconductor manufacturing equipment is processed through a corresponding process.

In the semiconductor manufacturing process, processes using plasma, such as etching and deposition, are widely used. A plasma processing process is generally performed by placing a substrate at the bottom of a plasma treatment space, supplying fluid for plasma processing, and applying voltage by an antenna located at the top.

In producing multi-stage semiconductor products such as current vertical NAND (VNAND) flash memory, the aspect ratio (AR) is increasing. Accordingly, in order to achieve a higher etch rate, greater plasma power is required than before in 300 mm wafer pre-process plasma etching equipment. However, since this causes greater thermal damage to an electrostatic chuck (ESC), which is an essential element of etching equipment, cooling heat of coolant used in conventional electrostatic chucks alone cannot sufficiently offset heat energy.

To avoid thermal damage to the electrostatic chuck, control of the cooling temperature to extremely low temperatures (up to −100° C.) may be necessary. In such a cryogenic environment, the components of the electrostatic chuck may shrink. In particular, fluid leakage may occur at a connection portion of a fluid supplying pipe that supplies gas into the electrostatic chuck.

The foregoing is intended merely to aid in the understanding of the background of the present disclosure, and is not intended to mean that the present disclosure falls within the purview of the related art that is already known to those skilled in the art.

SUMMARY

Accordingly, the present disclosure has been made keeping in mind the above problems occurring in the related art, and an objective of the present disclosure is to provide a sealing member that prevents fluid leakage even in a cryogenic environment, a fluid supplying device including the sealing member, and a substrate processing apparatus including the fluid supplying device.

In order to achieve the above objective, according to one aspect of the present disclosure, there is provided a sealing member, including: a sealing jacket having a ring shape; an upper O-ring mounted on an upper surface of the sealing jacket; a lower O-ring mounted on a lower surface of the sealing jacket; and a pressure ring inserted into a receiving portion of the sealing jacket and pressing the upper surface and the lower surface.

According to an embodiment of the present disclosure, the receiving portion may be formed on an inner wall of the sealing jacket.

According to an embodiment of the present disclosure, the receiving portion may be formed on an outer wall of the sealing jacket.

According to an embodiment of the present disclosure, the pressure ring may be a ring-shaped coil spring inserted into the receiving portion.

According to an embodiment of the present disclosure, the pressure ring may be inserted into the receiving portion.

According to an embodiment of the present disclosure, the pressure ring may be made of phenyl vinyl methyl silicone (PVMQ).

According to another aspect of the present disclosure, there is provided a fluid supplying device connecting a fluid supplying pipe and an electrostatic chuck to each other, the fluid supplying device including: a fluid connection block having a fluid supplying hole connected to a fluid supplying pipe that supplies a fluid to the electrostatic chuck; and a sealing member mounted around the fluid supplying hole and sealing a space between the fluid connection block and the electrostatic chuck. The sealing member may include: a sealing jacket having a ring shape; an upper O-ring mounted on an upper surface of the sealing jacket; a lower O-ring mounted on a lower surface of the sealing jacket; and a pressure ring inserted into a receiving portion of the sealing jacket and pressing the upper surface and the lower surface.

According to an embodiment of the present disclosure, the fluid supplying hole may include: a first fluid supplying hole connected to a first fluid supplying pipe that supplies a first fluid at a first pressure higher than an atmospheric pressure; and a second fluid supplying hole connected to a second fluid supplying pipe that supplies a second fluid at a second pressure lower than the atmospheric pressure.

According to an embodiment of the present disclosure, the first fluid may be a coolant.

According to an embodiment of the present disclosure, the second fluid may be helium (He).

According to an embodiment of the present disclosure, the sealing member may include: a first sealing member mounted around the first fluid supplying hole; and a second sealing member mounted around the second fluid supplying hole.

According to an embodiment of the present disclosure, the first sealing member may be configured such that the receiving portion is formed on an inner wall of the sealing jacket.

According to an embodiment of the present disclosure, the second sealing member may be configured such that the receiving portion is formed on an outer wall of the sealing jacket.

According to another aspect of the present disclosure, there is provided a substrate processing apparatus, including: an electrostatic chuck on which a substrate is mounted; a fluid supplying pipe supplying a fluid for controlling a temperature of the substrate to the electrostatic chuck; and a fluid supplying device connecting the fluid supplying pipe and the electrostatic chuck to each other. The fluid supplying device may include: a fluid connection block having a fluid supplying hole connected to a fluid supplying pipe that supplies the fluid to the electrostatic chuck; and a sealing member mounted around the fluid supplying hole and sealing a space between the fluid connection block and the electrostatic chuck. The sealing member may include: a sealing jacket having a ring shape; an upper O-ring mounted on an upper surface of the sealing jacket; a lower O-ring mounted on a lower surface of the sealing jacket; and a pressure ring inserted into a receiving portion of the sealing jacket and pressing the upper surface and the lower surface.

According to an embodiment of the present disclosure, the fluid connection block and the sealing jacket may be made of one of polyetheretherketone (PEEK), Teflon, Vespel, Celazole, and perfluoroalkoxy (PFA), and the upper O-ring, the lower O-ring, and the pressure ring may be made of phenyl vinyl methyl silicone (PVMQ)

According to the present disclosure, as the upper and lower surfaces on which the upper O-ring and the lower O-ring are mounted are pressed by the pressure ring, the upper O-ring and the lower O-ring can seal the connection portion of the fluid supplying pipe.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION

Figure 1:
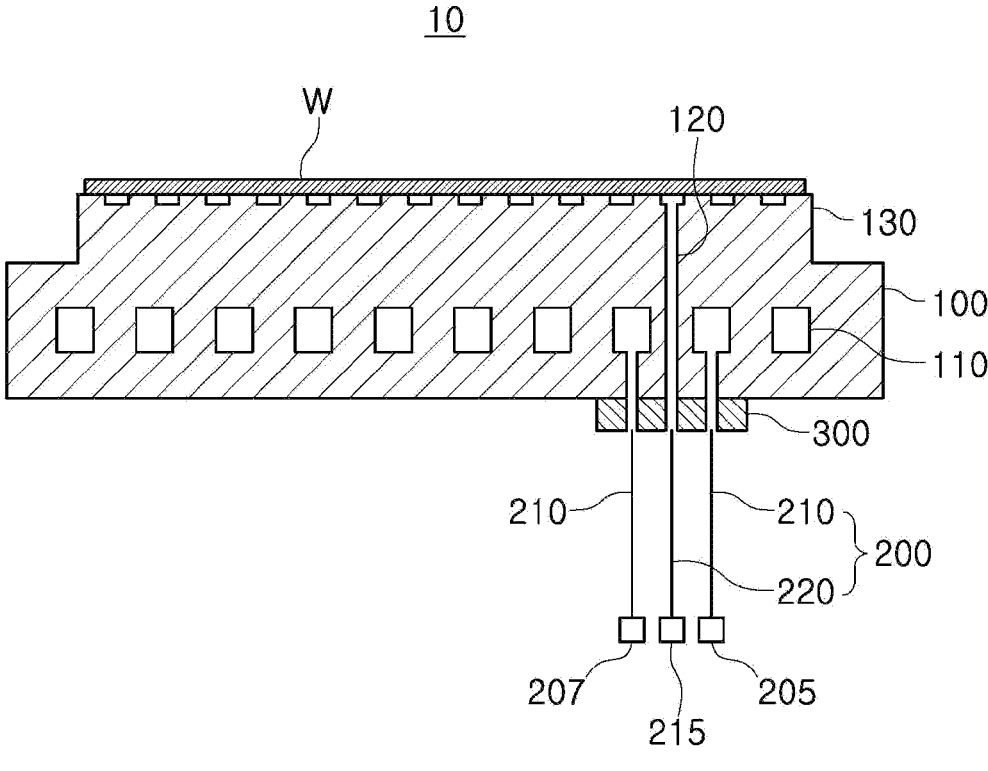
FIG. 1 is a view schematically illustrating the structure of a substrate processing apparatus according to the present disclosure.

Hereinafter, exemplary embodiments will be described in detail with reference to the accompanying drawings so that those skilled in the art may easily practice the present disclosure. The present disclosure may be implemented in various suitable forms and is not limited to the exemplary embodiments described in the present specification.

Portions unrelated to the description will be omitted in order to obviously describe embodiments, and similar components will be denoted by the same reference numerals throughout the present specification.

In addition, in several exemplary embodiments, components having the same configuration will be representatively described using the same reference numerals in an exemplary embodiment, and only components different from those of an exemplary embodiment will be described in the other exemplary embodiments.

It will be understood that when elements are referred to as being "connected (or coupled)" to each other, the elements are "directly connected (or coupled)" to each other or are "indirectly connected (or coupled)" to each other with intervening elements therebetween. Unless the context clearly indicates otherwise, it will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms including technical and scientific terms used herein have the same meaning as commonly understood by one of ordinary skill in the art to which the present disclosure belongs. It will be further understood that terms used herein should be interpreted as having a meaning that is consistent with their meaning in the context of this specification and the relevant art and will not be interpreted in an idealized or overly formal sense unless expressly so defined herein.

Hereinafter, a sealing member 320 that prevents fluid leakage even in a cryogenic environment, a fluid supplying device 300 including the same, and a substrate processing apparatus 10 including the same will be described. The substrate processing apparatus 10 according to the present disclosure performs processing such as etching and deposition on a substrate W.

FIG. 1 is a view schematically illustrating the structure of the substrate processing apparatus 10 according to the present disclosure. The substrate processing apparatus 10 according to the present disclosure includes an electrostatic chuck 100 that supports the substrate W, a fluid supplying pipe 200 that supplies a fluid for controlling the temperature of the substrate W to the electrostatic chuck 100, and the fluid supplying device 300 that connects the fluid supplying pipe 200 and the electrostatic chuck 100 to each other. Although not illustrated, the substrate processing apparatus 10 may include a processing fluid supplying unit that supplies a processing fluid for processing the substrate W, and a power source and an electrode that generate plasma using the processing fluid.

The electrostatic chuck 100 supports the substrate W placed thereon to perform a processing process. The electrostatic chuck 100 may function as a lower electrode for generating plasma. A temperature control device for temperature control may be provided inside the electrostatic chuck 100. The temperature control device includes a heater for heating, a first flow path 110 through which a first fluid for cooling flows, and a second flow path 120 through which a second fluid for transferring the temperature of the electrostatic chuck 100 to the substrate W flows. As illustrated in FIG. 1, the first flow path 110 and the second flow path 120 may be formed inside the electrostatic chuck 100.

According to an embodiment of the present disclosure, the first fluid is a coolant. The coolant may be one of FC, HT, NOVEC series, and ethylene glycol from 3M.

According to an embodiment of the present disclosure, the second fluid is helium (He). As the second fluid, helium (He) as well as other inert fluids such as neon (Ne) and argon (Ar) may be used.

The fluid supplying pipe 200 provides a path for supplying the fluid to the electrostatic chuck 100. For example, the first fluid and the second fluid for temperature control may flow to the electrostatic chuck 100 through the fluid supplying pipe 200. The fluid supplying pipe 200 may include a first fluid supplying pipe 210 through which the first fluid (e.g., coolant) flows and a second fluid supplying pipe 220 through which the second fluid (e.g., He) flows. The first fluid supplying pipe 210 may connect a first fluid source 205 and the first flow path 110 to each other, and the first flow path 110 and a fluid discharge port 207 to each other. In addition, the second fluid supplying pipe 220 may connect a second fluid source 215 and the second flow path 120 to each other. The fluid supplying pipe 200 is connected to the fluid supplying device 300, and the fluid is provided into the electrostatic chuck 100 through the fluid supplying device 300.

The fluid supplying device 300 supplies the fluid flowing through the fluid supplying pipe 200 to the electrostatic chuck 100. A first end of the fluid supplying device 300 is connected to the fluid supplying pipe 200, and a second end of the fluid supplying device 300 is connected to the electrostatic chuck 100.

Figure 2:
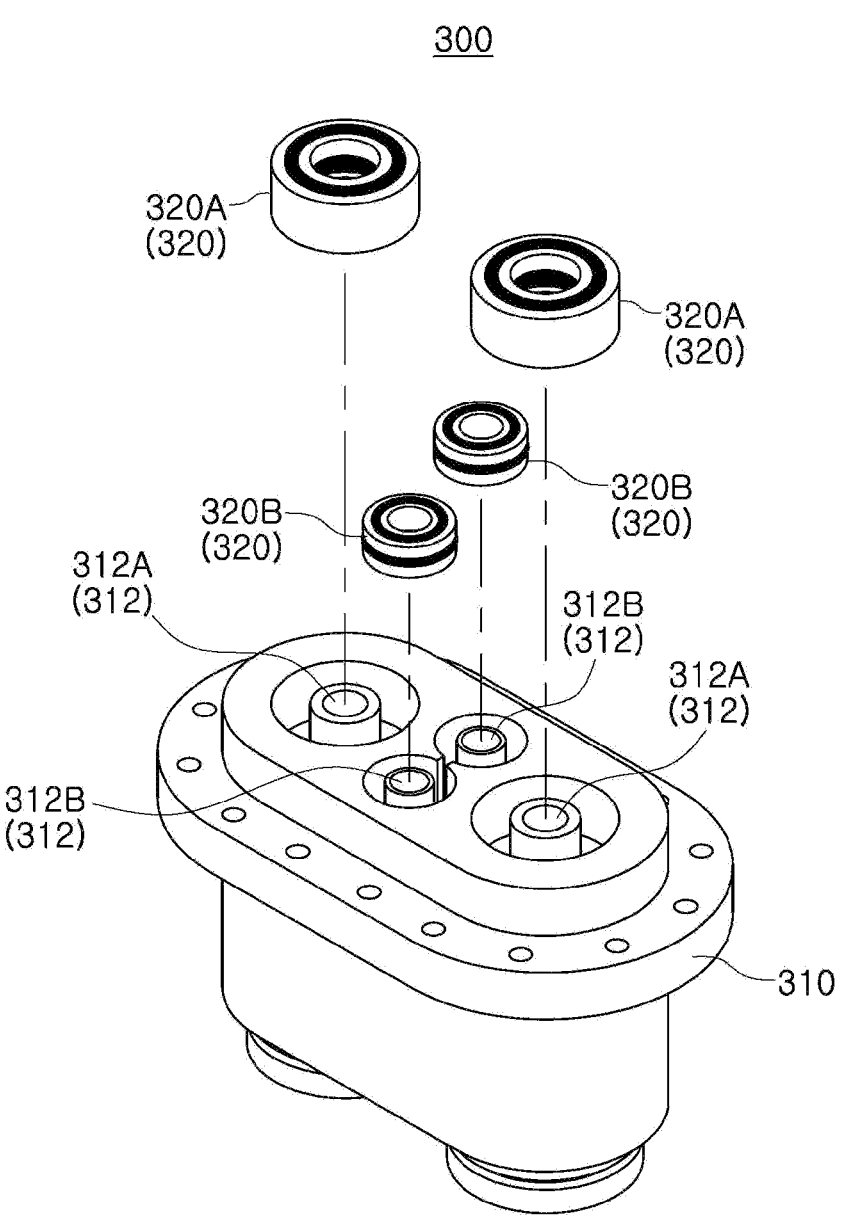
FIG. 2 is a perspective view illustrating a fluid supplying device according to the present disclosure.
Figure 3:
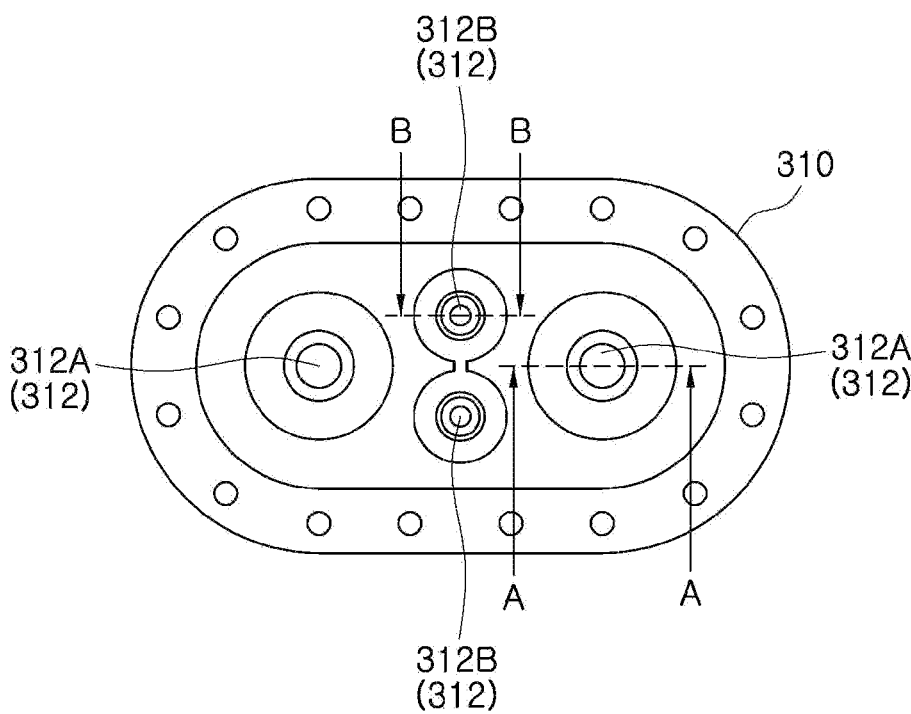
FIG. 3 is a top view illustrating the fluid supplying device according to the present disclosure.

The fluid supplying device 300 includes a fluid connection block 310 having a fluid supplying hole 312 connected to the fluid supplying pipe 200 that supplies fluid to the electrostatic chuck 100, and a sealing member 320 that is mounted around the fluid supplying hole 312 and seals a connection portion of the fluid supplying pipe 200. Referring to FIG. 2, the fluid supplying hole 312 is formed in the fluid connection block 310 to connect the fluid supplying pipe 200 and an internal flow path of the electrostatic chuck 100. In addition, a groove and a fastener for fastening the fluid supplying pipe 200 and the electrostatic chuck 100 are formed in the fluid connection block 310. The fluid supplying hole 312 includes a first fluid supplying hole 312A that supplies the first fluid (e.g., coolant) at a first pressure P1 higher than an atmospheric pressure Patm, and a second fluid supplying hole 312B that supplies the second fluid (e.g., He) at a second pressure P2 lower than the atmospheric pressure Patm. As illustrated in FIGS. 2 and 3, two first fluid supplying holes 312A are formed in the fluid connection block 310, and two second fluid supplying holes 312B are formed between the first fluid supplying holes 312A. The fluid supplying hole 312 may vary in shape, position, size, and number depending on system configuration. The fluid connection block 310 may be made of an electrical insulating material. For example, the fluid connection block 310 may be made of engineering plastic, such as polyetheretherketone (PEEK), Teflon, Vespel, Celazole, or perfluoroalkoxy (PFA).

The sealing member 320 is mounted around the fluid supplying hole 312 of the fluid supplying device 300 to seal a space between the fluid connection block 310 and the electrostatic chuck 100. The sealing member 320 may be inserted into a groove formed around the fluid supplying hole 312. A first sealing member 320A is mounted around each of the first fluid supplying holes 312A, and a second sealing member 320B is mounted around each of the second fluid supplying holes 312B. That is, the sealing member 320 includes the first sealing member 320A mounted around the first fluid supplying hole 312A, and the second sealing member 320B mounted around the second fluid supplying hole 312B. The sealing member 320 needs to be made of a material that satisfies chemical resistance requirements for coolant or processing fluid, as well as resistance conditions in an extremely low temperature (e.g., −100° C.) environment. Therefore, virgin polytetrafluoroethylene (PTFE) or a material obtained by mixing PTFE and PI may be used for the sealing member 320.

The sealing member 320 will be described with reference to FIGS. 4A, 4B or FIGS. 9A, 9B.

Figure 4A:
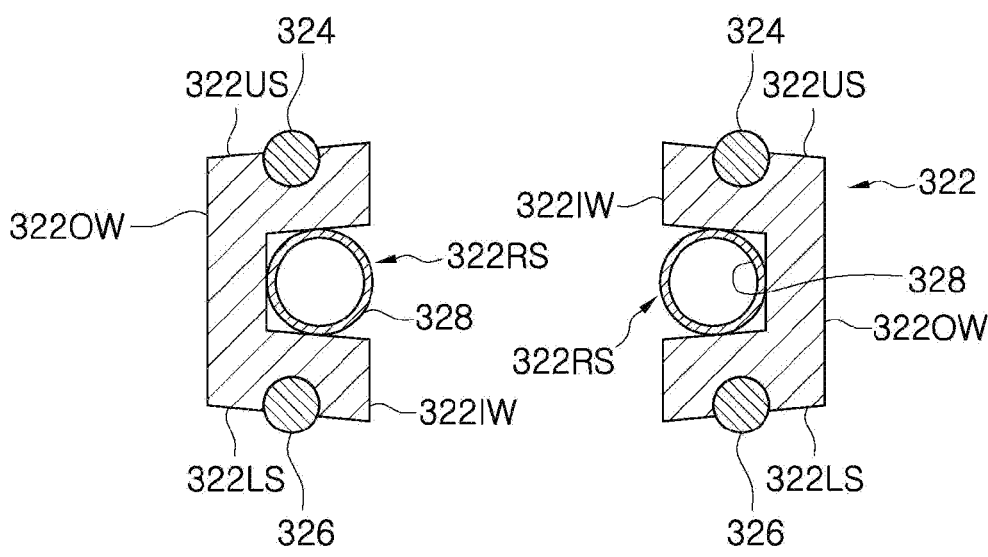
FIGS. 4A and 4B are views illustrating a sealing member in which a receiving portion is formed on an inner wall of a sealing jacket.
Figure 4B:
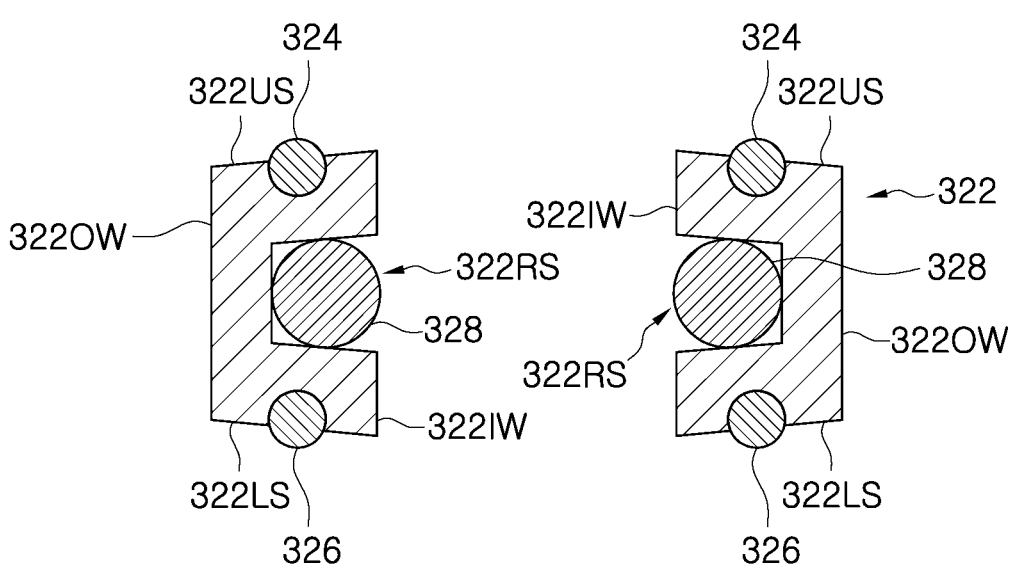
Figure 9A:
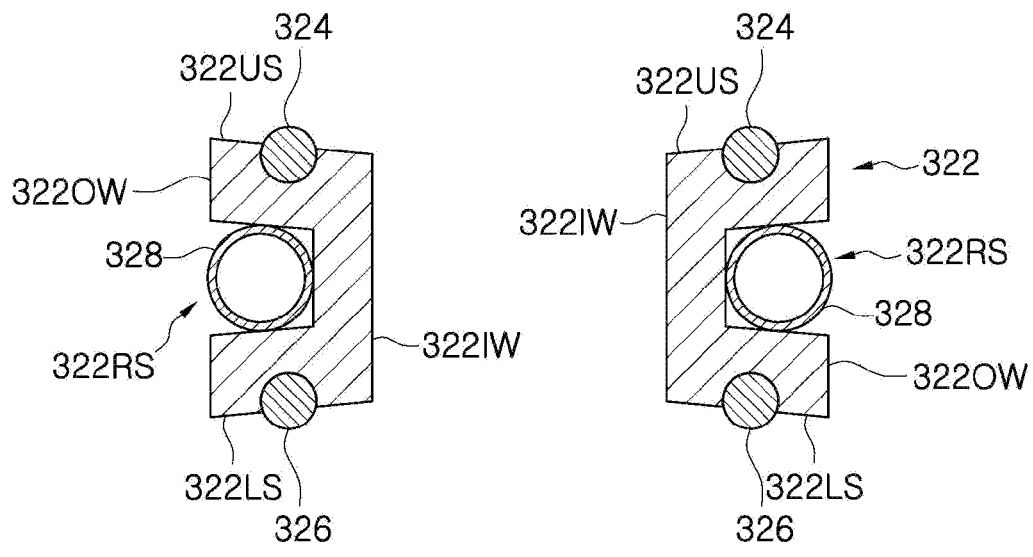
FIGS. 9A and 9B are views illustrating a sealing member in which a receiving portion is formed on an outer wall of a sealing jacket.
Figure 9B:
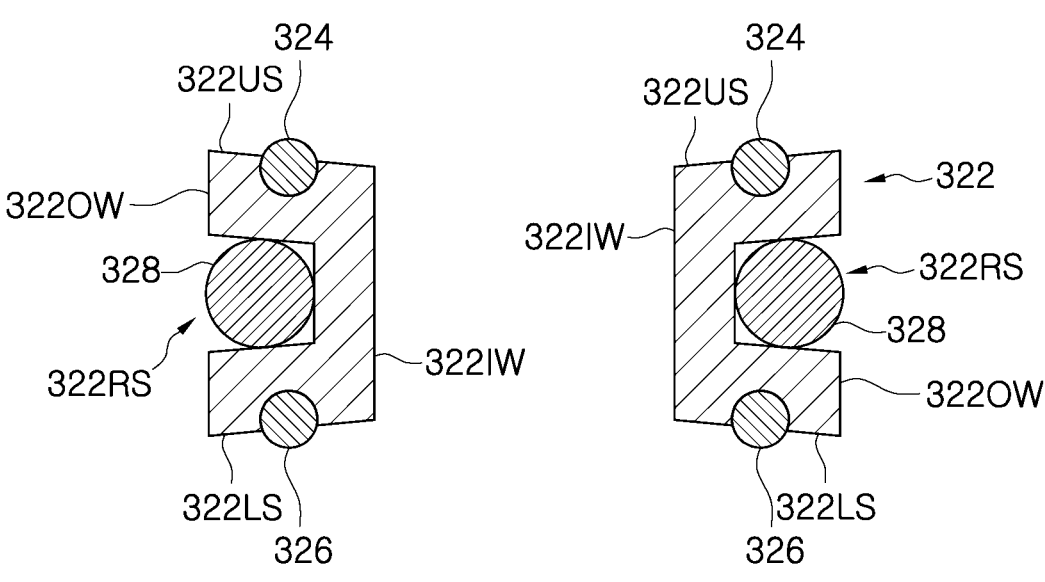

FIGS. 4A, 4B illustrate a section of a first sealing member 320A as an example of the sealing member 320, and FIGS. 9A, 9B illustrate a section of a second sealing member 320B as another example of the sealing member 320. Referring to FIGS. 4A, 4B, the sealing member 320A includes a sealing jacket 322 having a ring shape, an upper O-ring 324 mounted on an upper surface 322US of the sealing jacket 322, a lower O-ring 326 mounted on a lower surface 322LS of the sealing jacket 322, and a pressure ring 328 inserted into a receiving portion 322RS of the sealing jacket 322 and pressing the upper surface 322US and the lower surface 322LS. The first sealing member 320A is configured such that the receiving portion 322RS is formed on an inner wall 322IW of the sealing jacket 322. Referring to FIGS. 9A, 9B, the second sealing member 320B is configured such that the receiving portion 322RS is formed on an outer wall 322OW of the sealing jacket 322. The pressure ring 328 may be a coil spring with hollow space as shown in FIGS. 4A and 9A, or the pressure ring 328 may be an O-ring as shown in FIGS. 4B and 9B.

According to the present disclosure, the pressure ring 328 inserted into the receiving portion 322RS of the sealing jacket 322 presses the upper surface 322US and the lower surface 322LS of the sealing jacket 322 in the upper and lower directions, respectively (i.e., push the upper surface 322US and the lower surface 322LS in opposite directions). That is, the pressure ring 328 widens the upper surface 322US and the lower surface 322LS of the sealing jacket 322 in the upper and lower directions. Therefore, the upper O-ring 324 and the lower O-ring 326 mounted on the upper surface 322US and the lower surface 322LS are brought into close contact with a lower surface of the electrostatic chuck 100 and the fluid connection block 310. As a result, even when the electrostatic chuck 100 or the fluid connection block 310 shrinks in a cryogenic environment, the upper O-ring 324 and the lower O-ring 326 are kept in close contact with the lower surface of the electrostatic chuck 100 and the fluid connection block 310.

As illustrated in FIG. 2, the sealing jacket 322 is provided in a ring shape to be inserted around the fluid supplying hole 312 of the fluid connection block 310. The upper O-ring 324 and the lower O-ring 326 may be mounted in grooves formed on the upper surface 322US and the lower surface 322LS of the sealing jacket 322. The receiving portion 322RS into which the pressure ring 328 is inserted may be formed on the inner wall 322IW or the outer wall 322OW of the sealing jacket 322. The sealing jacket 322 may be made of engineering plastic, such as polyetheretherketone (PEEK), Teflon, Vespel, Celazole, or perfluoroalkoxy (PFA), for electrical insulation and thermal insulation.

The upper O-ring 324 and the lower O-ring 326 are inserted into the upper surface 322US and the lower surface 322LS of the sealing jacket 322. The upper O-ring 324 and the lower O-ring 326 seal the space between the electrostatic chuck 100 and the fluid connection block 310. The materials of the upper O-ring 324 and the lower O-ring 326 may vary depending on the type of fluid to be sealed. For example, the upper O-ring 324 and the lower O-ring 326 may be made of phenyl vinyl methyl silicone (PVMQ), which has chemical resistance and is not deformed in a cryogenic environment (e.g., −100° C.).

According to an embodiment of the present disclosure, the pressure ring 328 may be a ring-shaped coil spring or an O-ring inserted into the receiving portion 322RS. The upper surface 322US and the lower surface 322LS of the sealing jacket 322 may be pressed in the upper and lower directions by an elastic force of the pressure ring 328. Meanwhile, since radio frequency (RF) power is applied to the electrostatic chuck 100 as a lower electrode, Material of the pressure ring 328 may be changed according to a radio frequency (RF) voltage applied to the electrostatic chuck 100 and a breakdown voltage of the sealing jacket 322.

The pressure ring 328 may be designed considering chemical resistance to coolant and deformation of the sealing jacket 322. An elastic spring used as the pressure ring 328 may be a hollow spring (e.g., helical spring, cantilever spring) as depicted in FIGS. 4A and 9A. As the material of the elastic spring, SUS 316L (EP), nickel alloy, and Hastelloy may be used. The elastic spring made of metal may be used when a breakdown voltage of the sealing jacket 322 is greater than an RF voltage applied to the electrostatic chuck 100.

When the breakdown voltage of the sealing jacket 322 is lower than the RF voltage applied to the electrostatic chuck 100, a current flow may occur at the point of contact between the metal elastic spring used as the pressure ring 328 and the sealing jacket 322. In this case, the pressure ring 328 with electrical insulating properties is used. According to an embodiment of the present disclosure, the pressure ring 328 is an O-ring inserted into the receiving portion 322RS as depicted in FIGS. 4B and 9B. That is, an O-ring of the same type as the upper O-ring 324 and the lower O-ring 326 may be used as the pressure ring 328. The pressure ring 328 may be made of phenyl vinyl methyl silicone (PVMQ).

Figure 5:
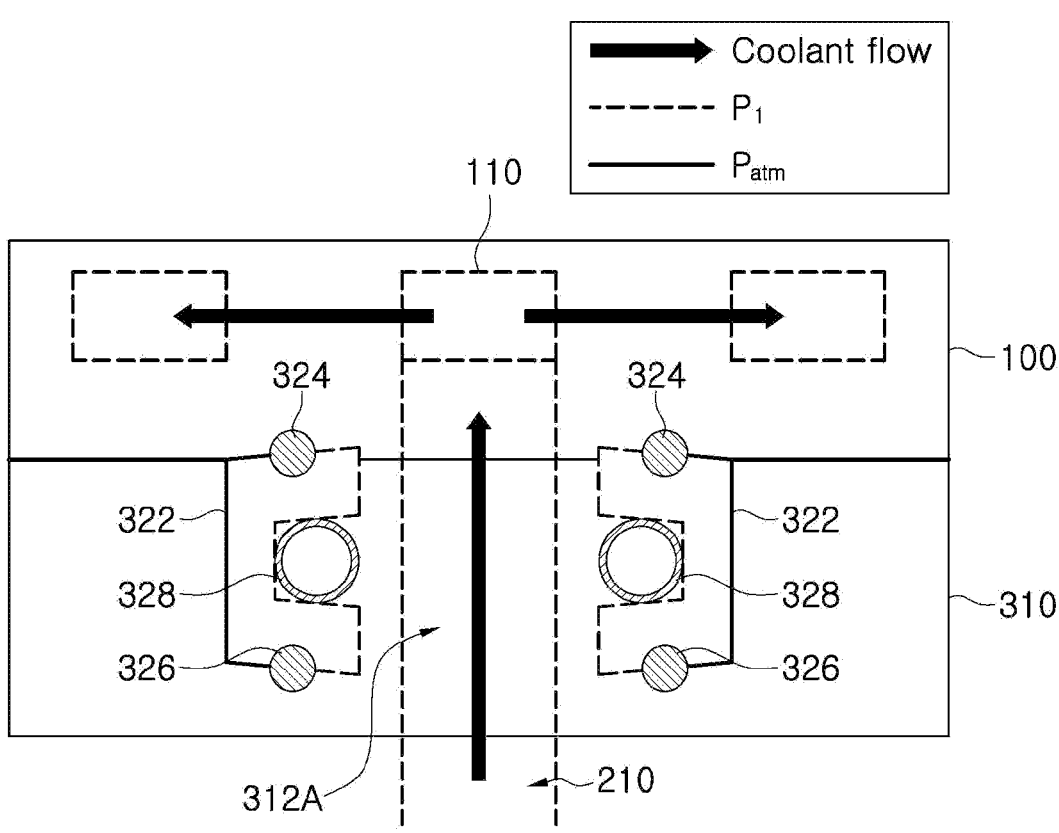
FIG. 5 is a view illustrating a state in which the sealing member illustrated in FIG. 4A is coupled to an electrostatic chuck.

Hereinafter, the principle of sealing the space between the fluid connection block 310 and the electrostatic chuck 100 by the sealing member 320 according to the present disclosure will be described. FIG. 5 is a view illustrating a state in which the first sealing member 320A illustrated in FIG. 4A is coupled to the electrostatic chuck 100. In particular, FIG. 5 illustrates a section taken along line A-A' of FIG. 3.

Referring to FIG. 5, the fluid connection block 310 is coupled to a connection portion between the first flow path 110 and the first fluid supplying pipe 210 at a position under the electrostatic chuck 100. Here, the first flow path 110 and the first fluid supplying pipe 210 may be connected to each other through the first fluid supplying hole 312A of the fluid connection block 310. The first fluid (e.g., coolant) is supplied through the first fluid supplying pipe 210, and the first fluid flows into the first flow path 110 through the first fluid supplying hole 312A. Here, the first fluid is supplied at the first pressure P1 higher than the atmospheric pressure Patm. The coolant is provided to maintain the temperature of the electrostatic chuck 100 below a predetermined temperature, that is, to cool the electrostatic chuck 100.

In FIG. 5, a portion indicated by a dotted line represents an area pressurized by the first fluid, and a portion indicated by a thick solid line represents an area pressurized by the atmospheric pressure. Referring to FIG. 5, the pressure ring 328 of the first sealing member 320A is deformed elongatedly in the upper and lower directions due to the first pressure P1 applied by the first fluid, and the deformation of the pressure ring 328 causes the upper O-ring 324 and the lower O-ring 326 to be pressed in the upper and lower directions. As the upper O-ring 324 and the lower O-ring 326 are pressed in the upper and lower directions, the space between the electrostatic chuck 100 and the fluid connection block 310 is more tightly sealed. In particular, even when the electrostatic chuck 100 and the fluid connection block 310 shrink in a cryogenic environment, the upper O-ring 324 and the lower O-ring 326 maintains the sealing of the space between the electrostatic chuck 100 and the fluid connection block 310.

Figure 6:
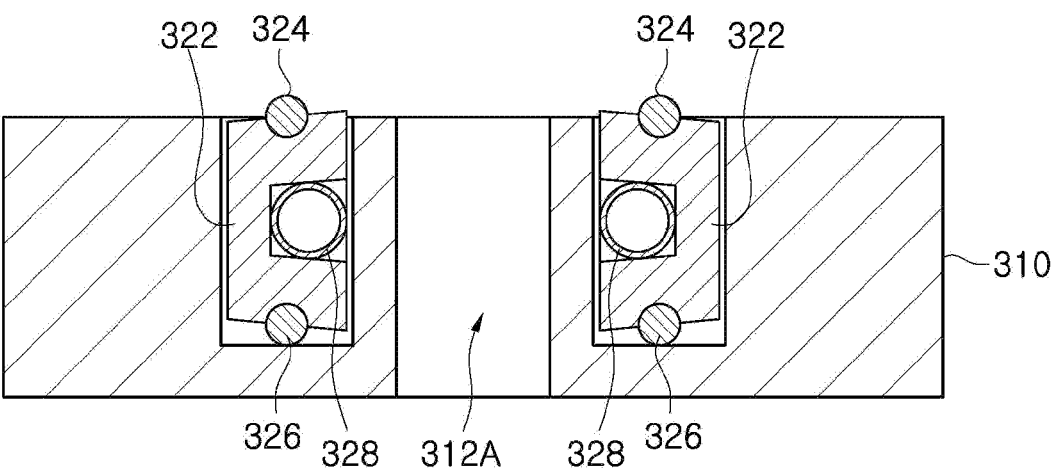
FIGS. 6 to 8 are views illustrating the process of sealing the fluid supplying device by the sealing member illustrated in FIG. 4A.
Figure 7:
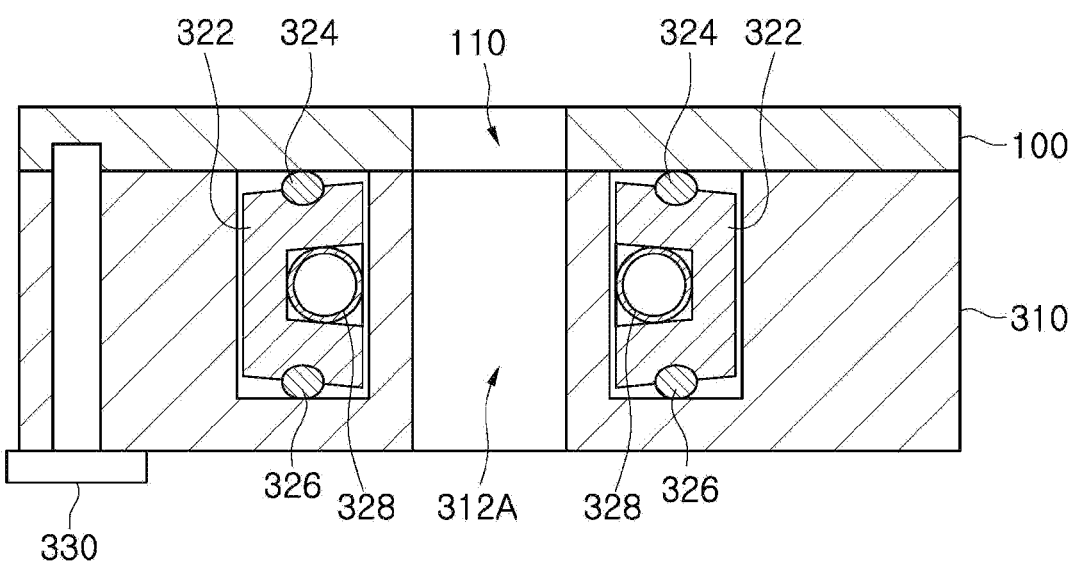
Figure 8:
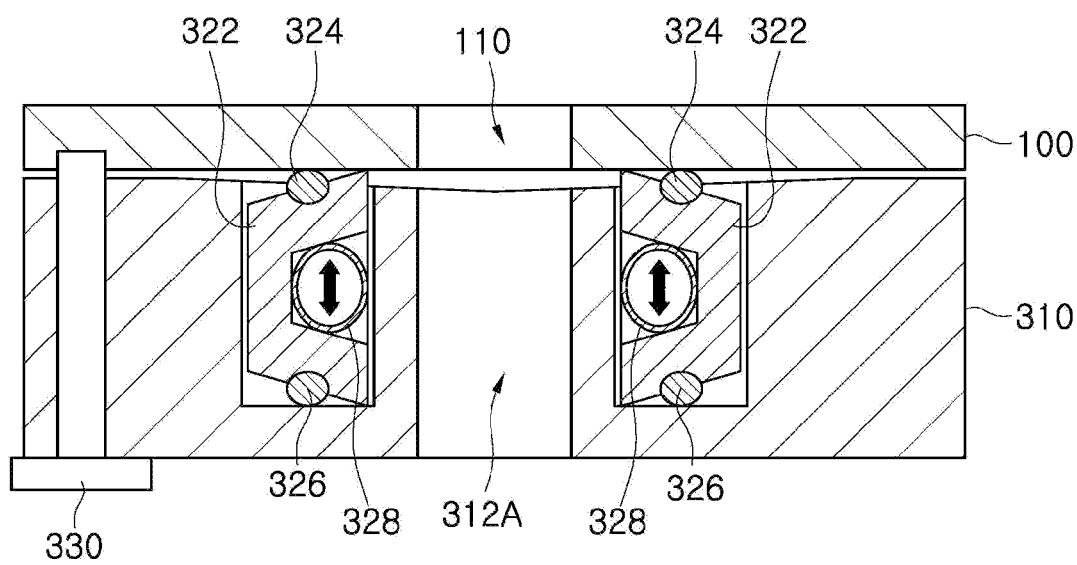

FIGS. 6 to 8 are views illustrating the process of sealing the fluid supplying device 300 by the first sealing member 320A illustrated in FIG. 4A. FIG. 6 illustrates a state in which the first sealing member 320A is coupled to the fluid connection block 310. FIG. 7 illustrates a state in which the fluid connection block 310 in which the first sealing member 320A is mounted is coupled to a lower portion of the electrostatic chuck 100. FIG. 8 illustrates a state in which the electrostatic chuck 100 and the fluid connection block 310 shrink in a cryogenic environment when the first fluid is supplied to the first flow path 110 through the first fluid supplying hole 312A.

As illustrated in FIG. 6, the first sealing member 320A is inserted into a groove formed around the first fluid supplying hole 312A of the fluid connection block 310. Each of the upper surface 322US and the lower surface 322LS of the sealing jacket 322 has an inclined shape such that a central portion thereof protrudes further than a peripheral portion thereof. A vertical height of the first sealing member 320A is set to be greater than that of a groove of the sealing jacket 322. When the first sealing member 320A is mounted in the groove of the sealing jacket 322, a part of the first sealing member 320A protrudes as illustrated in FIG. 6.

Referring to FIG. 7, the fluid connection block 310 is coupled to the electrostatic chuck 100 through a bolt 330. Here, as the upper O-ring 324 and the lower O-ring 326 are elastically compressed by the electrostatic chuck 100, the upper O-ring 324 and the lower O-ring 326 are brought into close contact with the electrostatic chuck 100 and the fluid connection block 310 in the upper and lower directions. Afterwards, as illustrated in FIG. 8, even when the fluid connection block 310 and the electrostatic chuck 100 shrink in a cryogenic environment, the upper O-ring 324 and the lower O-ring 326 are kept in close contact with the electrostatic chuck 100 and the fluid connection block 310, thereby preventing leakage of the first fluid.

FIGS. 9A, 9B are views illustrating the second sealing member 322B in which the receiving portion 322RS is formed on the outer wall 3220W of the sealing jacket 322. FIGS. 9A and 9B illustrate a section taken along line B-B' of FIG. 3. Referring to FIG. 9A, the pressure ring 328 which is a coil spring with hollow space is inserted into the receiving portion 322RS formed on the outer wall 3220W of the second sealing member 322B. Referring to FIG. 9B, the pressure ring 328 which is an O-ring is inserted into the receiving portion 322RS formed on the outer wall 3220W of the second sealing member 322B. The pressure ring 328 inserted into the receiving portion 322RS of the sealing jacket 322 presses the upper surface 322US and the lower surface 322LS of the sealing jacket 322 in the upper and lower directions, respectively. That is, the pressure ring 328 widens the upper surface 322US and the lower surface 322LS of the sealing jacket 322 in the upper and lower directions. Therefore, the upper O-ring 324 and the lower O-ring 326 mounted on the upper surface 322US and the lower surface 322LS are brought into close contact with a

9 | 10 lower surface of the electrostatic chuck 100 and the fluid connection block 310. As a result, even when the electrostatic chuck 100 or the fluid connection block 310 shrinks in a cryogenic environment, the upper O-ring 324 and the lower O-ring 326 are kept in close contact with the lower surface of the electrostatic chuck 100 and the fluid connection block 310.

Figure 10:
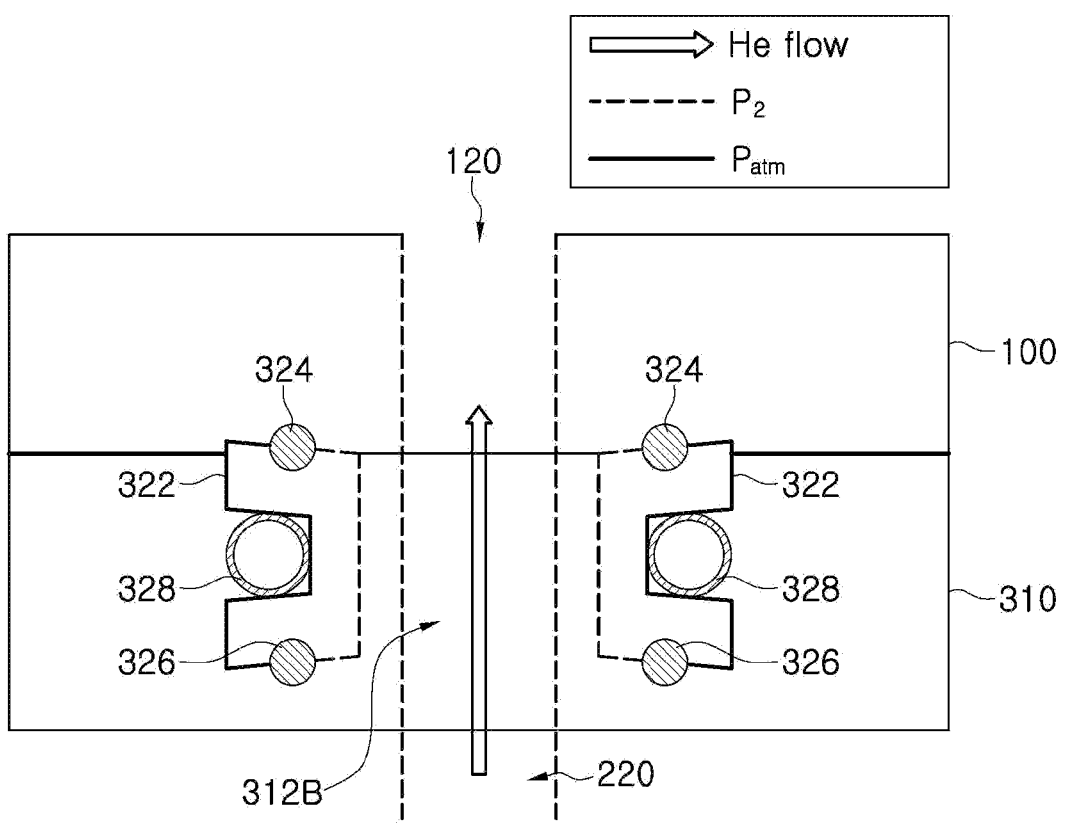
FIG. 10 is a view illustrating a state in which the sealing member illustrated in FIG. 9A is coupled to an electrostatic chuck.

Referring to FIG. 10, the fluid connection block 310 is coupled to a connection portion between the second flow path 120 and the second fluid supplying pipe 220 at a position under the electrostatic chuck 100. Here, the second flow path 120 and the second fluid supplying pipe 220 may be connected to each other through the second fluid supplying hole 312B of the fluid connection block 310. The second fluid (e.g., He) is supplied through the second fluid supplying pipe 220, and the second fluid flows into the second flow path 120 through the second fluid supplying hole 312B. Here, the second fluid is supplied at the second pressure P2 lower than the atmospheric pressure Patm. The He fluid supplied as the second fluid is provided to transfer the temperature of the electrostatic chuck 100 to the substrate W. Referring to FIG. 1, a groove through which the second fluid flows is formed on an upper surface of the electrostatic chuck 100 where the substrate W is placed. The groove formed on the surface of the electrostatic chuck 100 is connected to the second flow path 120. The second fluid flows along a lower surface of the substrate W through the second flow path 120, and the temperature of the electrostatic chuck 100 is transferred to the substrate W by the second fluid. For example, while the electrostatic chuck 100 is maintained at a cryogenic temperature by the first fluid, the substrate W may be cooled by the second fluid.

Meanwhile, during the processing, an internal space of a plasma processing chamber needs to be maintained in a vacuum state. Therefore, the second fluid is supplied at a very low pressure so as not to affect the vacuum environment of the chamber. That is, the second fluid is supplied at the second pressure P2 lower than the atmospheric pressure Patm.

In FIG. 10, a portion indicated by a dotted line represents an area pressurized by the second fluid, and a portion indicated by a thick solid line represents an area pressurized by the atmospheric pressure. Compared to the case of FIG. 5, since the receiving portion 322RS in which the pressure ring 328 is accommodated is formed on the outer wall 3220W that is pressurized by the relatively high atmospheric pressure Patm, the pressure ring 328 is deformed by the atmospheric pressure Patm. Referring to FIG. 10, the pressure ring 328 of the first sealing member 320A is deformed elongatedly in the upper and lower directions due to the atmospheric pressure Patm, and the deformation of the pressure ring 328 causes the upper O-ring 324 and the lower O-ring 326 to be pressed in the upper and lower directions. As the upper O-ring 324 and the lower O-ring 326 are pressed in the upper and lower directions, the space between the electrostatic chuck 100 and the fluid connection block 310 is more tightly sealed. In particular, even when the electrostatic chuck 100 and the fluid connection block 310 shrink in a cryogenic environment, the upper O-ring 324 and the lower O-ring 326 maintain the sealing of the space between the electrostatic chuck 100 and the fluid connection block 310.

Figure 11:
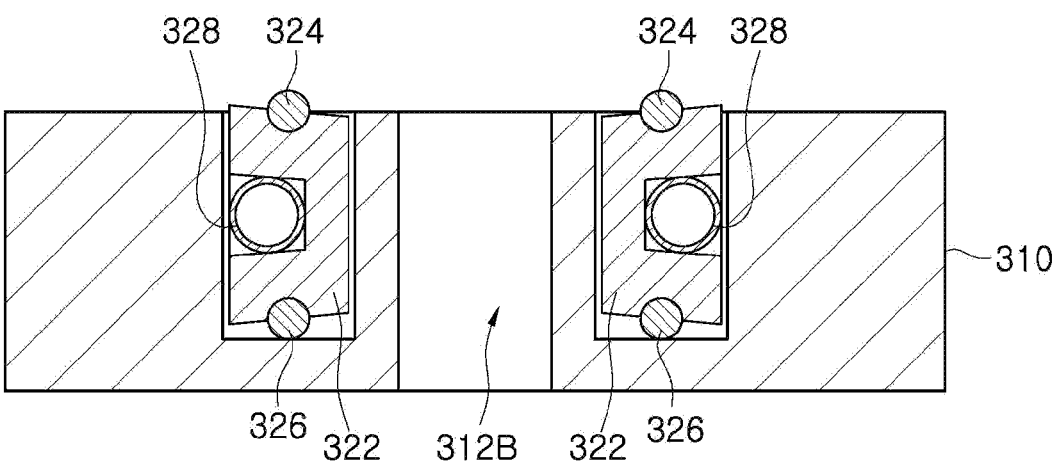
FIGS. 11 to 13 are views illustrating the process of sealing the fluid supplying device by the sealing member illustrated in FIG. 9A.
Figure 12:
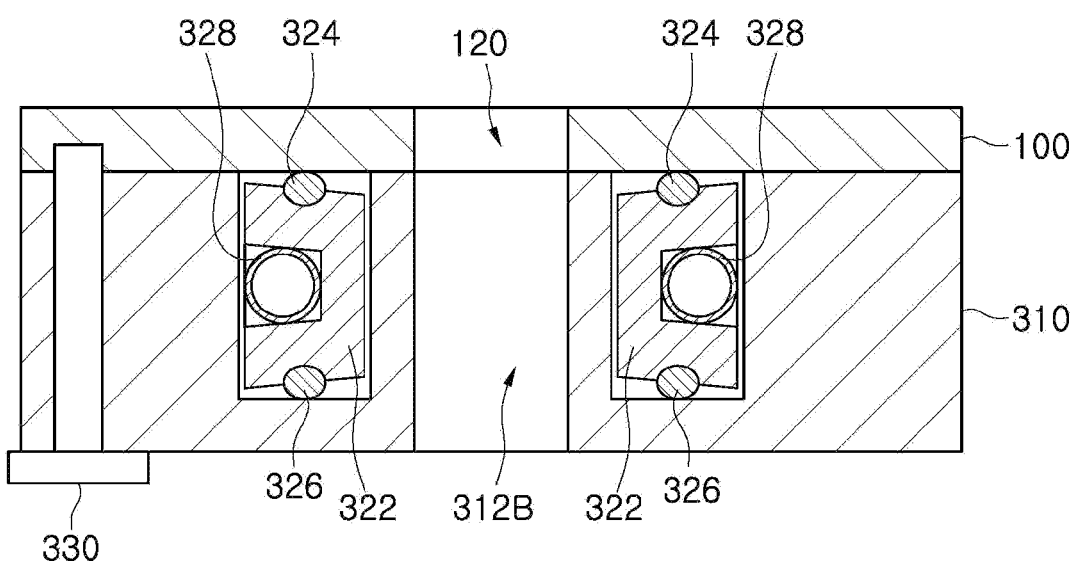
Figure 13:
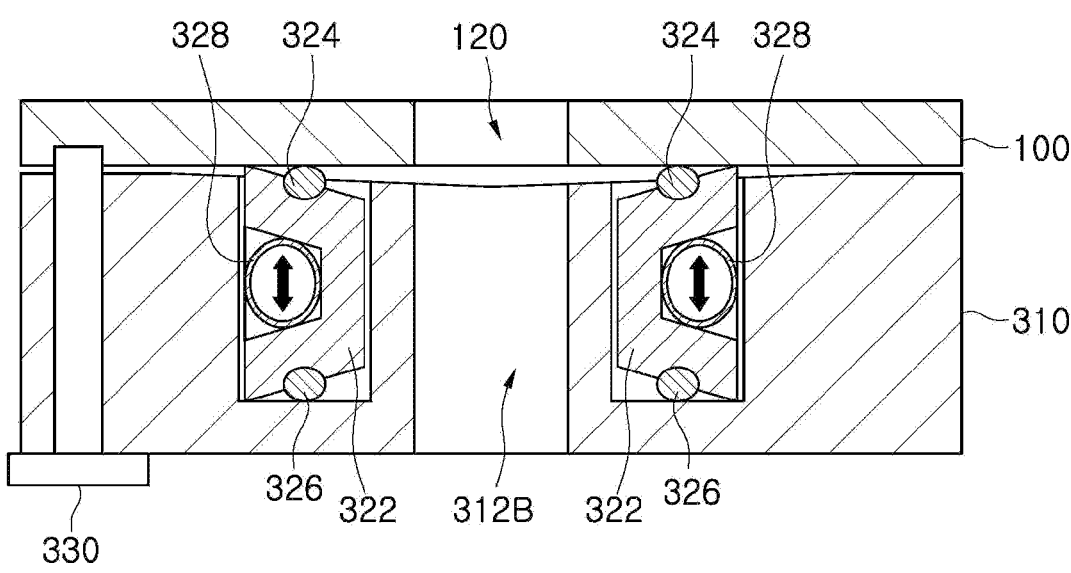

FIGS. 11 to 13 are views illustrating the process of sealing the fluid supplying device 300 by the second sealing member 320B illustrated in FIG. 9A. FIG. 11 illustrates a state in which the second sealing member 320B is coupled to the fluid connection block 310. FIG. 12 illustrates a state in which the fluid connection block 310 in which the second sealing member 320B is mounted is coupled to a lower portion of the electrostatic chuck 100. FIG. 13 illustrates a state in which the electrostatic chuck 100 and the fluid connection block 310 shrink in a cryogenic environment when the second fluid is supplied to the second flow path 120 through the second fluid supplying hole 312B.

As illustrated in FIG. 11, the second sealing member 320B is inserted into a groove formed around the second fluid supplying hole 312B of the fluid connection block 310. Each of the upper surface 322US and the lower surface 322LS of the sealing jacket 322 has an inclined shape such that a peripheral portion thereof protrudes further than a central portion thereof. A vertical height of the second sealing member 320B is set to be greater than that of a groove of the sealing jacket 322. When the second sealing member 320B is mounted in the groove of the sealing jacket 322, a part of the second sealing member 320B protrudes as illustrated in FIG. 11.

Referring to FIG. 12, the fluid connection block 310 is coupled to the electrostatic chuck 100 through a bolt 330. Here, as the upper O-ring 324 and the lower O-ring 326 are elastically compressed by the electrostatic chuck 100, the upper O-ring 324 and the lower O-ring 326 are brought into close contact with the electrostatic chuck 100 and the fluid connection block 310 in the upper and lower directions. Afterwards, as illustrated in FIG. 13, even when the fluid connection block 310 and the electrostatic chuck 100 shrink in a cryogenic environment, the upper O-ring 324 and the lower O-ring 326 are kept in close contact with the electrostatic chuck 100 and the fluid connection block 310, thereby preventing leakage of the second fluid.

While the present disclosure has been described in connection with what is presently considered to be practical exemplary embodiments, it is to be understood that the present disclosure is not limited to the disclosed embodiments. The present disclosure, however, is not limited to only the exemplary embodiments set forth herein, and those skilled in the art will appreciate that the present disclosure can be embodied in many alternate forms.

Accordingly, the present disclosure is intended to cover not only the exemplary embodiments, but also various alternatives, modifications, equivalents and other embodiments that may be included within the spirit and scope of the present disclosure as defined by the appended claims.

What is claimed is:

1. A sealing member, comprising:
a sealing jacket having a ring shape;
an upper O-ring mounted on an upper surface of the sealing jacket;
a lower O-ring mounted on a lower surface of the sealing jacket; and
a pressure ring inserted into a receiving portion of the sealing jacket and configured to push the upper surface and the lower surface in opposite directions.

2. The sealing member of claim 1,
wherein the receiving portion is formed on an inner wall of the sealing jacket.

3. The sealing member of claim 1,
wherein the receiving portion is formed on an outer wall of the sealing jacket.

4. The sealing member of claim 1,
wherein the pressure ring is a ring-shaped coil spring inserted into the receiving portion.

5. The sealing member of claim 1,
wherein the pressure ring is an O-ring inserted into the receiving portion.

6. The sealing member of claim 5,
wherein the pressure ring is made of phenyl vinyl methyl silicone (PVMQ).

7. A fluid supplying device connecting a fluid supplying pipe and an electrostatic chuck to each other, the fluid supplying device comprising:
    a fluid connection block having a fluid supplying hole connected to the fluid supplying pipe that supplies a fluid to the electrostatic chuck; and
    a sealing member mounted around the fluid supplying hole and sealing a space between the fluid connection block and the electrostatic chuck,
    wherein the sealing member comprises:
    a sealing jacket having a ring shape;
    an upper O-ring mounted on an upper surface of the sealing jacket;
    a lower O-ring mounted on a lower surface of the sealing jacket; and
    a pressure ring inserted into a receiving portion of the sealing jacket and configured to push the upper surface and the lower surface in opposite directions.

8. The fluid supplying device of claim 7,
wherein the fluid supplying hole comprises:
    a first fluid supplying hole connected to a first fluid supplying pipe that supplies a first fluid at a first pressure higher than an atmospheric pressure; and
    a second fluid supplying hole connected to a second fluid supplying pipe that supplies a second fluid at a second pressure lower than the atmospheric pressure.

9. The fluid supplying device of claim 8,
wherein the first fluid is a coolant.

10. The fluid supplying device of claim 8,
wherein the second fluid is helium (He).

11. The fluid supplying device of claim 8,
wherein the sealing member comprises:
    a first sealing member mounted around the first fluid supplying hole; and
    a second sealing member mounted around the second fluid supplying hole.

12. The fluid supplying device of claim 11,
wherein the first sealing member is configured such that the receiving portion is formed on an inner wall of the sealing jacket.

13. The fluid supplying device of claim 11,
wherein the second sealing member is configured such that the receiving portion is formed on an outer wall of the sealing jacket.

14. The fluid supplying device of claim 7,
wherein the pressure ring is a ring-shaped coil spring inserted into the receiving portion.

15. The fluid supplying device of claim 7,
wherein the pressure ring is an O-ring inserted into the receiving portion.

16. The fluid supplying device of claim 15,
wherein the pressure ring is made of phenyl vinyl methyl silicone (PVMQ).

17. A substrate processing apparatus, comprising:
    an electrostatic chuck on which a substrate is mounted;
    a fluid supplying pipe supplying a fluid for controlling a temperature of the substrate to the electrostatic chuck; and
    a fluid supplying device connecting the fluid supplying pipe and the electrostatic chuck to each other,
    wherein the fluid supplying device comprises:
    a fluid connection block having a fluid supplying hole connected to the fluid supplying pipe that supplies the fluid to the electrostatic chuck; and
    a sealing member mounted around the fluid supplying hole and sealing a space between the fluid connection block and the electrostatic chuck, and
    wherein the sealing member comprises:
    a sealing jacket having a ring shape;
    an upper O-ring mounted on an upper surface of the sealing jacket;
    a lower O-ring mounted on a lower surface of the sealing jacket; and
    a pressure ring inserted into a receiving portion of the sealing jacket and configured to push the upper surface and the lower surface in opposite directions.

18. The substrate processing apparatus of claim 17,
wherein the fluid supplying hole comprises:
    a first fluid supplying hole connected to a first fluid supplying pipe that supplies a coolant at a first pressure higher than an atmospheric pressure; and
    a second fluid supplying hole connected to a second fluid supplying pipe that supplies helium (He) at a second pressure lower than the atmospheric pressure.

19. The substrate processing apparatus of claim 18,
wherein the sealing member comprises:
    a first sealing member mounted around the first fluid supplying hole; and
    a second sealing member mounted around the second fluid supplying hole,
    wherein the first sealing member is configured such that the receiving portion is formed on an inner wall of the sealing jacket, and
    wherein the second sealing member is configured such that the receiving portion is formed on an outer wall of the sealing jacket.

20. The substrate processing apparatus of claim 18,
wherein the fluid connection block and the sealing jacket are made of one of polyetheretherketone (PEEK), Teflon, Vespel, Celazole, and perfluoroalkoxy (PFA), and
wherein the upper O-ring, the lower O-ring, and the pressure ring are made of phenyl vinyl methyl silicone (PVMQ).

* * * * *